United States Patent [19]

Hamasaki

[11] Patent Number: 5,175,603
[45] Date of Patent: Dec. 29, 1992

[54] BIPOLAR TRANSISTOR

[75] Inventor: Toshihiko Hamasaki, Yokohama, Japan

[73] Assignee: Kabushiki Kaisha Toshiba, Kawasaki, Japan

[21] Appl. No.: 804,520

[22] Filed: Dec. 10, 1991

Related U.S. Application Data

[63] Continuation of Ser. No. 295,148, Jan. 10, 1989, abandoned.

[30] Foreign Application Priority Data

Jan. 30, 1988 [JP] Japan ................................. 63-20297
Jan. 30, 1988 [JP] Japan ................................. 63-20309

[51] Int. Cl.$^5$ ............................................. H01L 29/72
[52] U.S. Cl. ................................. 257/592; 257/515; 257/518
[58] Field of Search ...................... 357/34, 36, 20, 59, 357/68, 88, 49

[56] References Cited

U.S. PATENT DOCUMENTS

| | | | |
|---|---|---|---|
| 4,499,657 | 2/1985 | Ooga | 357/36 |
| 4,812,894 | 3/1989 | Nakamura et al. | 357/34 |
| 4,839,302 | 6/1989 | Kameyama et al. | 357/34 |

OTHER PUBLICATIONS

Design Considerations of High-Performance Narrow-Emitter Bipolar Transistors, IEEE Electron Device Letters, Apr. 1987, vol. EDL-8, No. 4, pp. 174-175.
Self-Aligned Transistor with Sidewall Base Electrode, IEEE Transaction on Electron Devices 1982, vol. ED-29, No. 4, pp. 596-600.
On the Punchthrough Characteristics of Advanced Self-Aligned Transistors, IEEE Transaction on Electron Devices, 1987, vol. ED-34, No. 7, pp. 1519-1523.
Flat Emitter Transistor with Self-Aligned Base, Japanese Journal of Applied Physics, 1981, vol. 20, Supplement 20-1, pp. 149-153.

Primary Examiner—Edward J. Wojciechowicz
Attorney, Agent, or Firm—Oblon, Spivak, McClelland, Maier & Neustadt

[57] ABSTRACT

A bipolar transistor excellent in the high speed performance comprises a buried region of a first conductivity type formed in a semiconductor substrate, said buried region having a high impurity concentration, a collector region of the first conductivity type formed on the buried region, a base region of a second conductivity type formed on the collector region, an emitter region of the first conductivity type formed on the base region, and an outer base region of the second conductivity type formed to surround the base and collector regions in such a manner that an ohmic contact is provided between the base region and said outer base region and a p-n junction is formed between the collector region and said outer base region. The concentration profile of the second conductivity type impurity in the depth direction of the outer base region is controlled in such a manner that, while the maximum voltage is applied between the base and emitter regions to turn the transistor on, the concentration of the second conductivity type impurity in the outer base region is kept higher than the concentration of the second conductivity type carrier in a base-widening region formed within the collector region, when the comparison is made at the same depth.

11 Claims, 16 Drawing Sheets

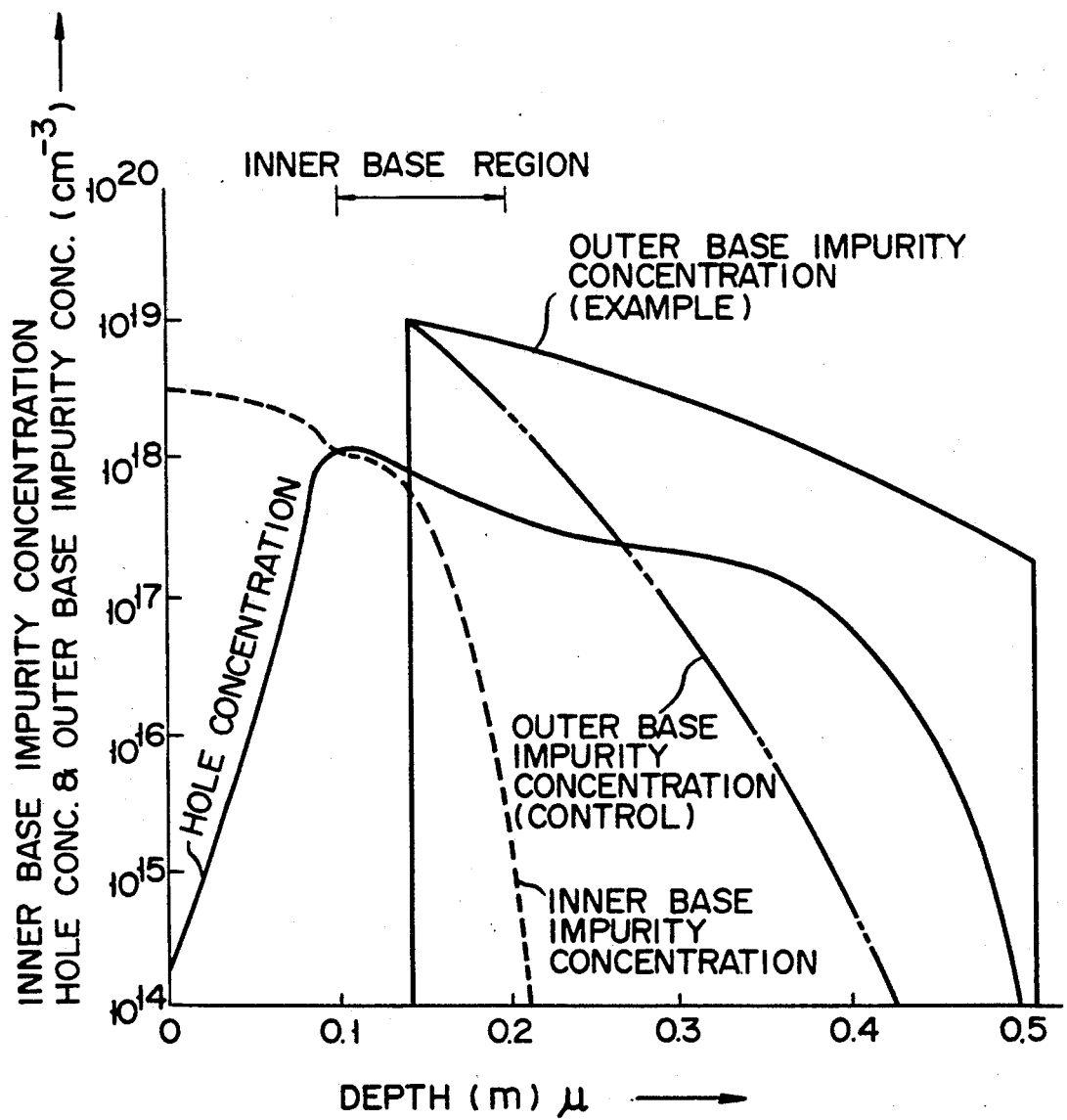
F I G. 4

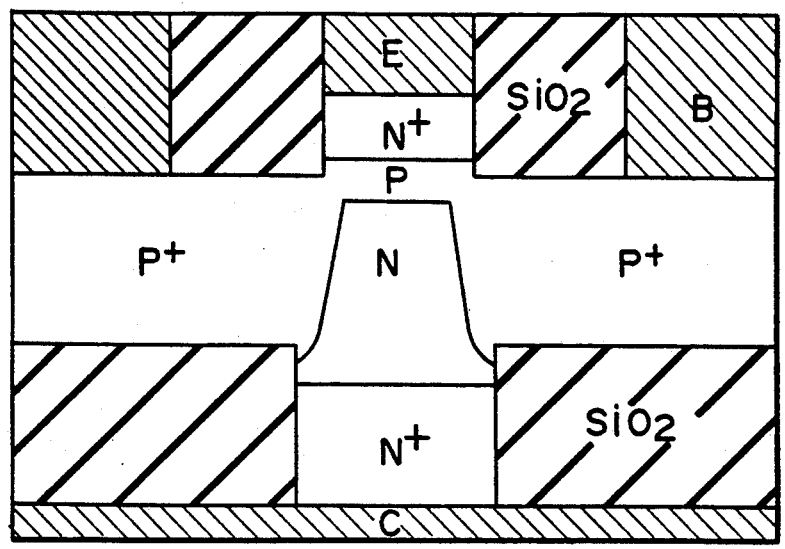
F I G. 5A
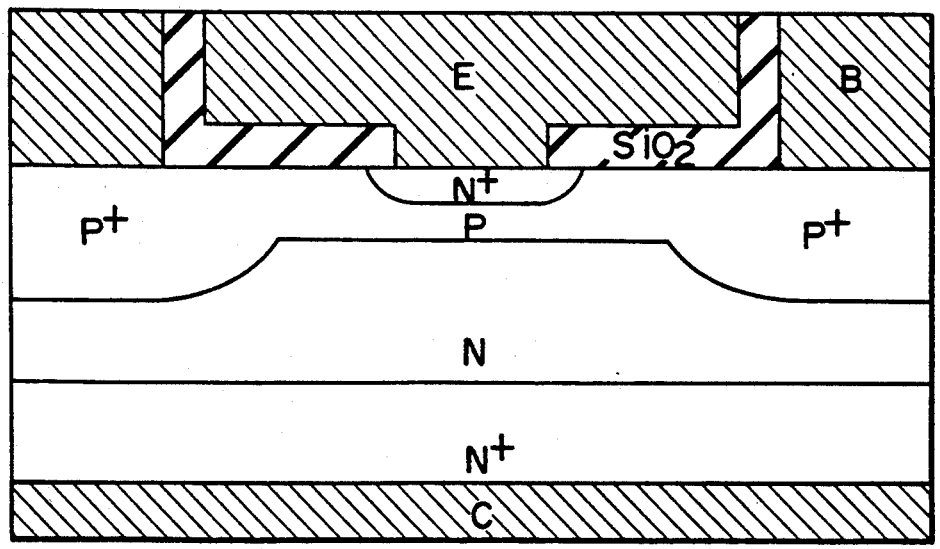
F I G. 5B

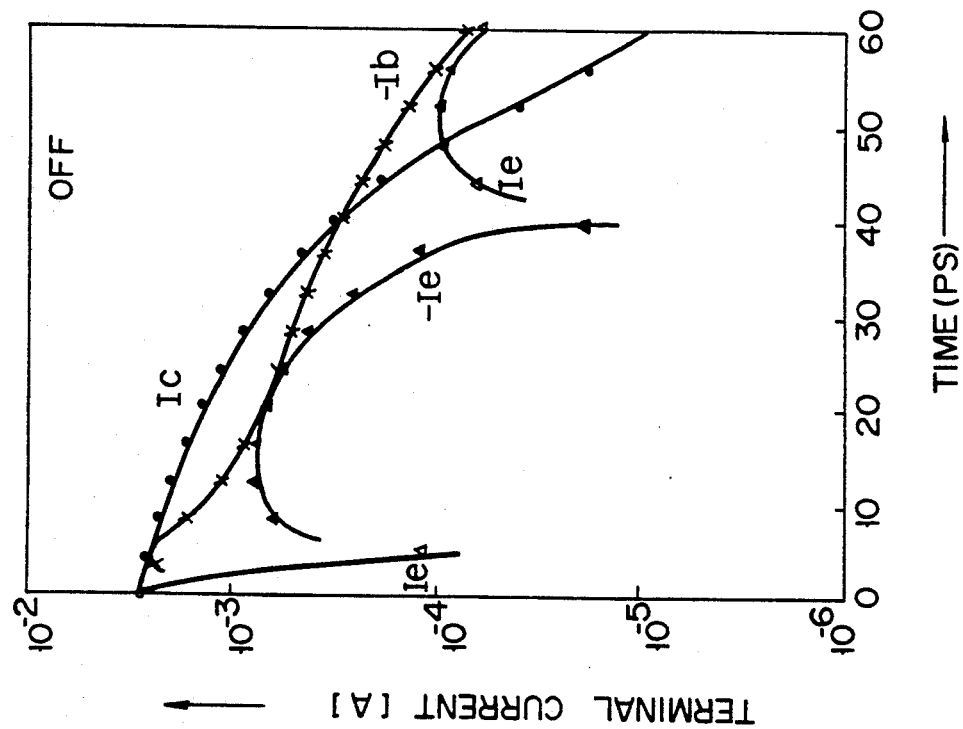
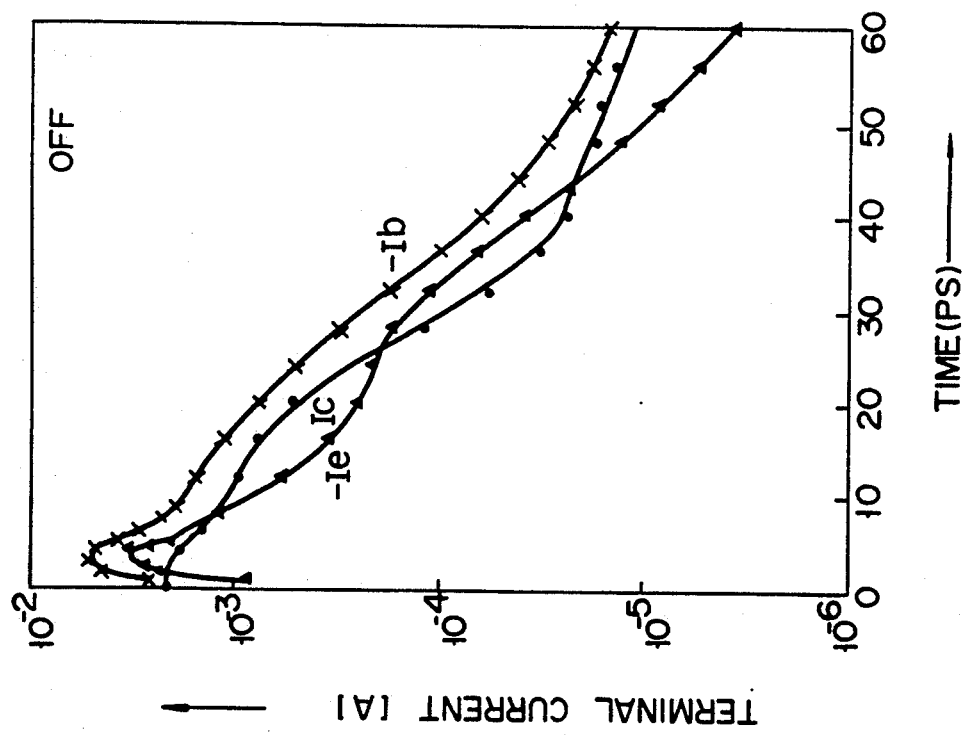
FIG. 7B
FIG. 7A

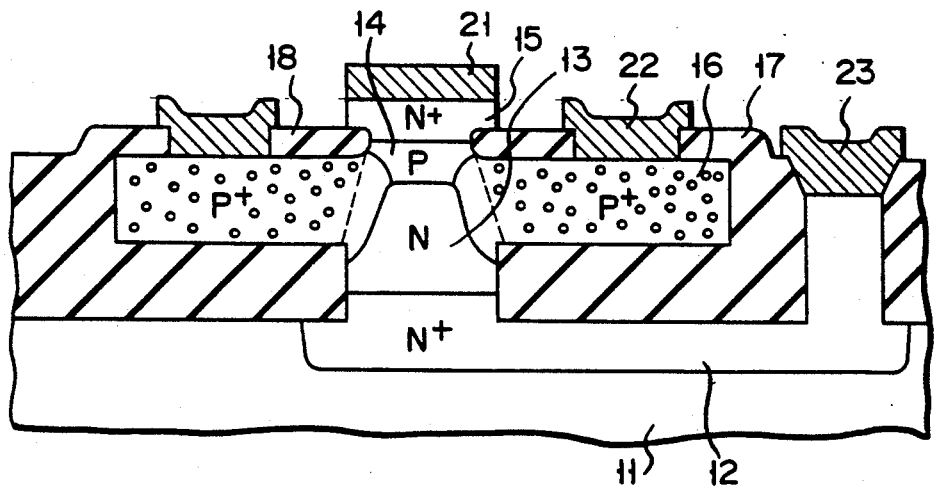
FIG. 8
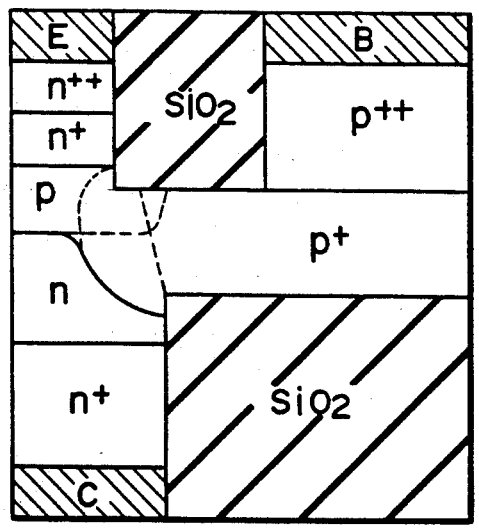 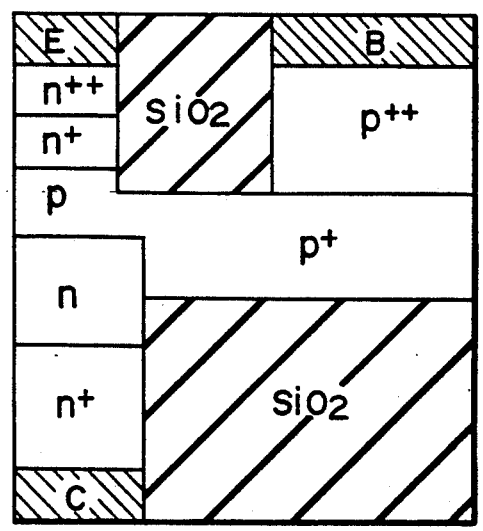
FIG. 9A                FIG. 9B

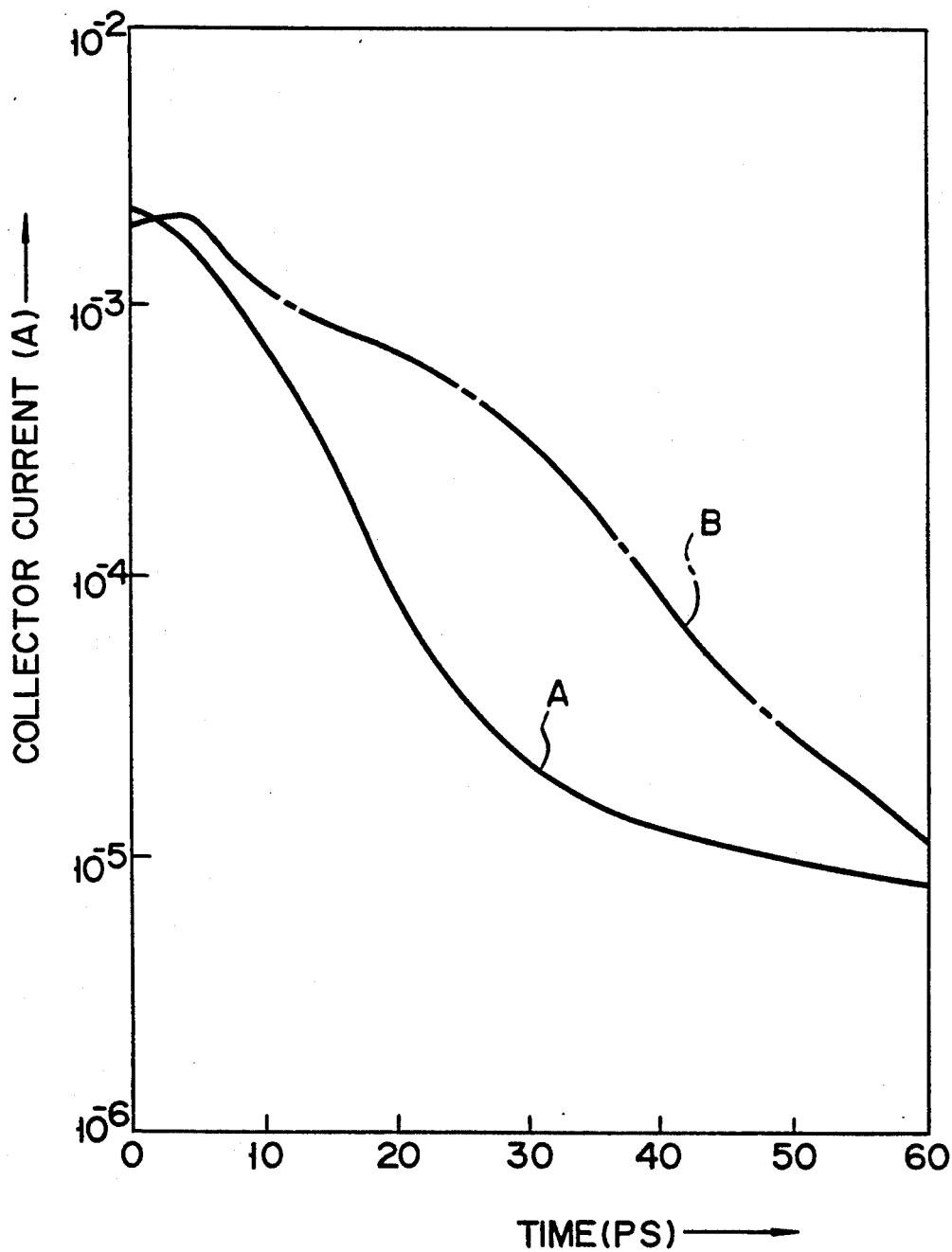
F I G. 10

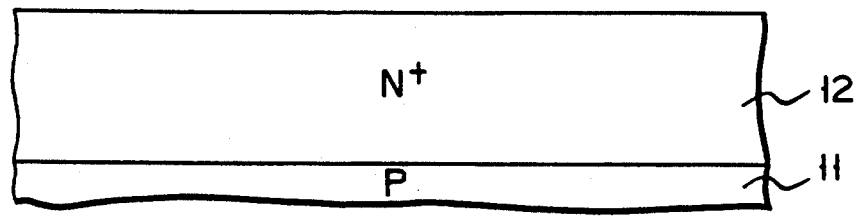
F I G. 11A
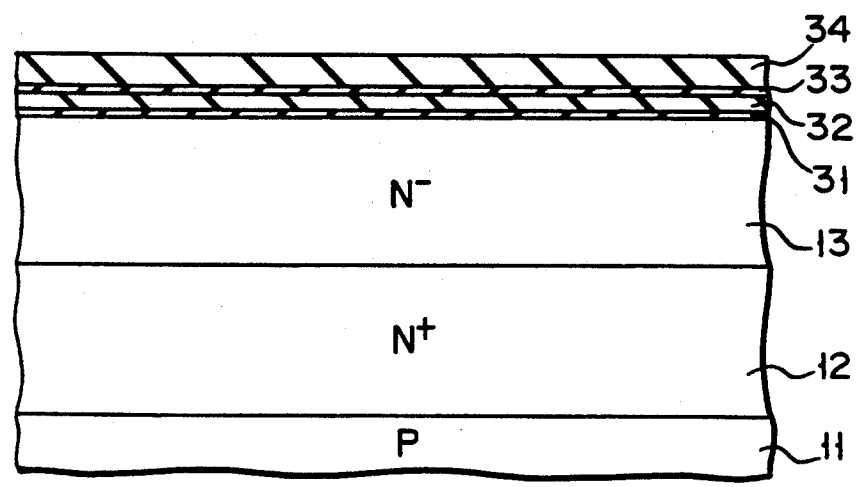
F I G. 11B
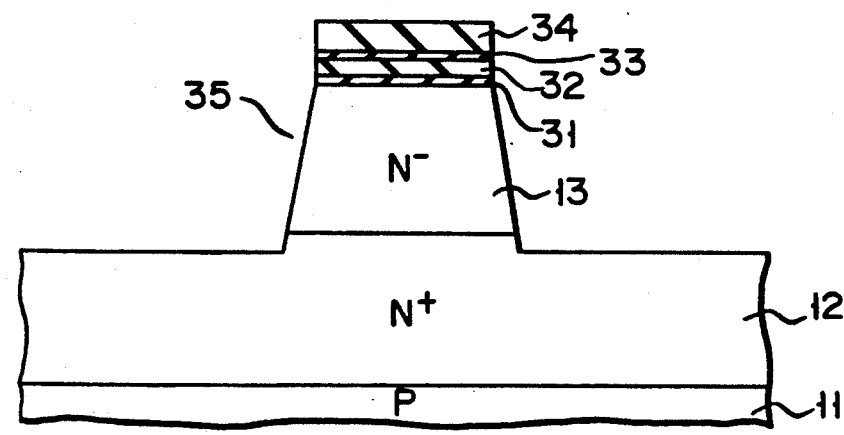
F I G. 11C

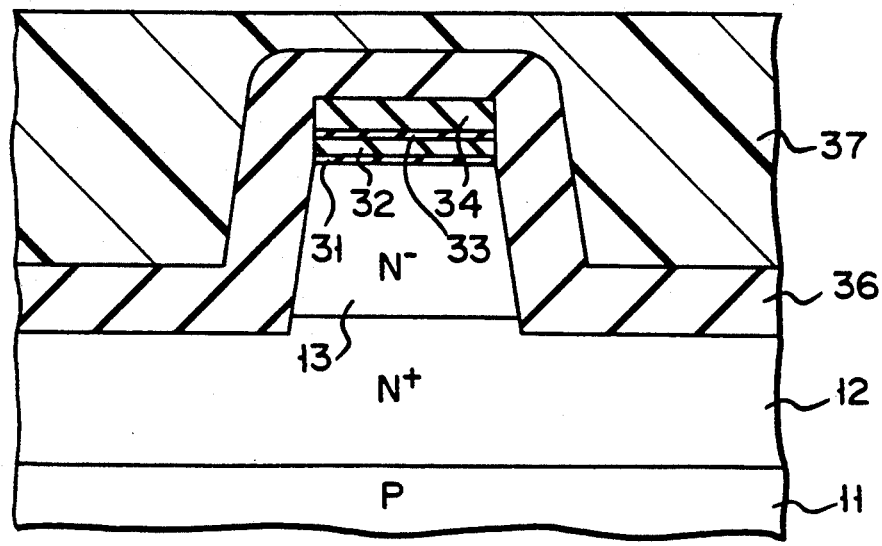
F I G. 11D
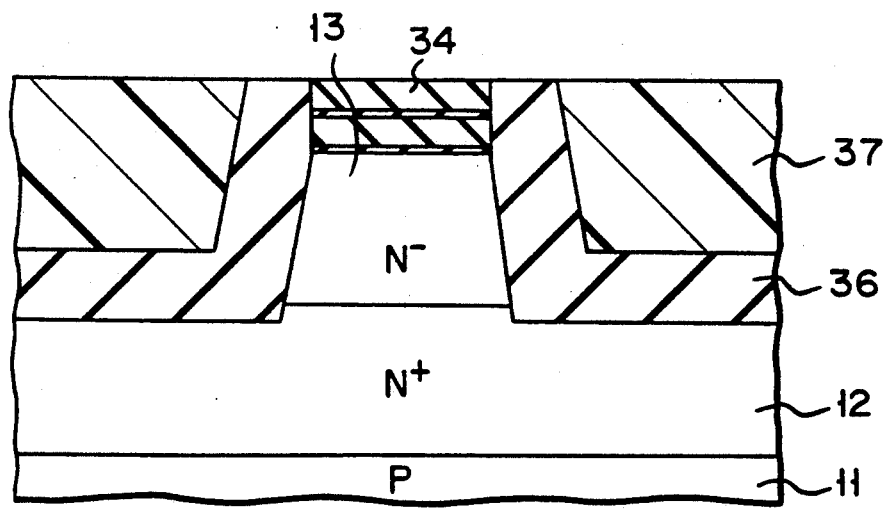
F I G. 11E

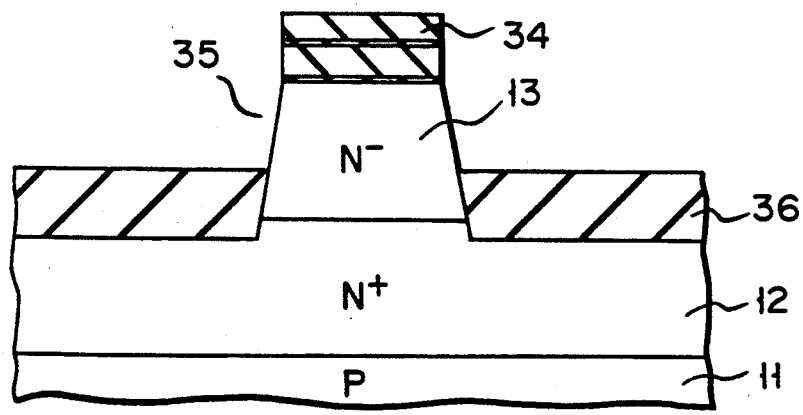
F I G. 11F
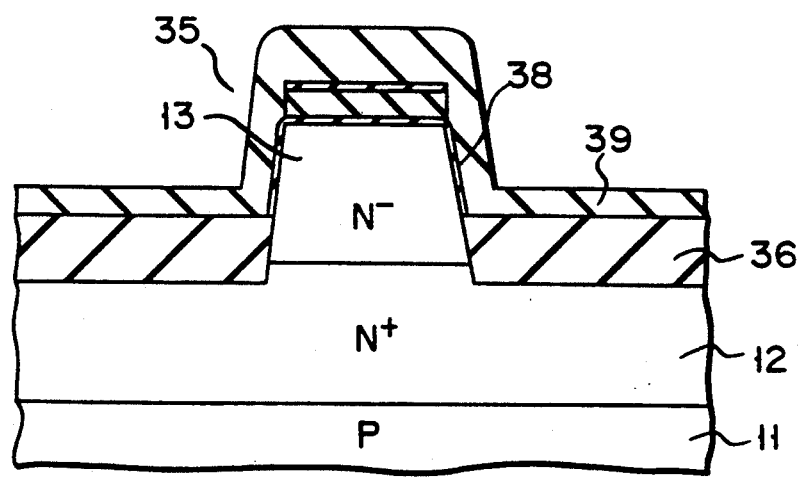
F I G. 11G
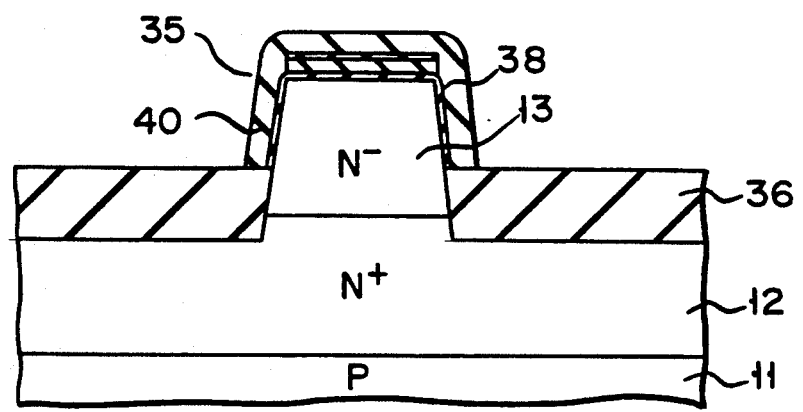
F I G. 11H

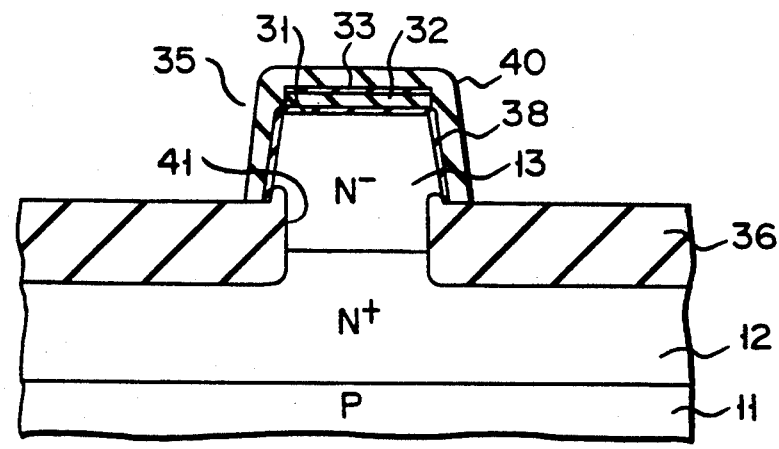
F I G. 11I
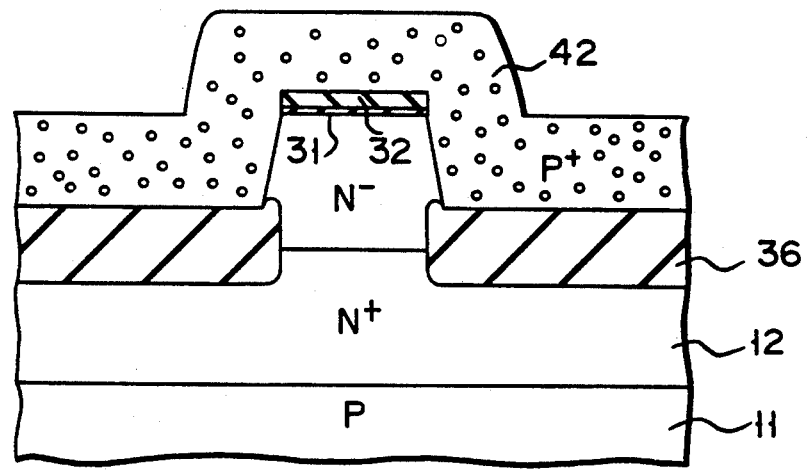
F I G. 11J
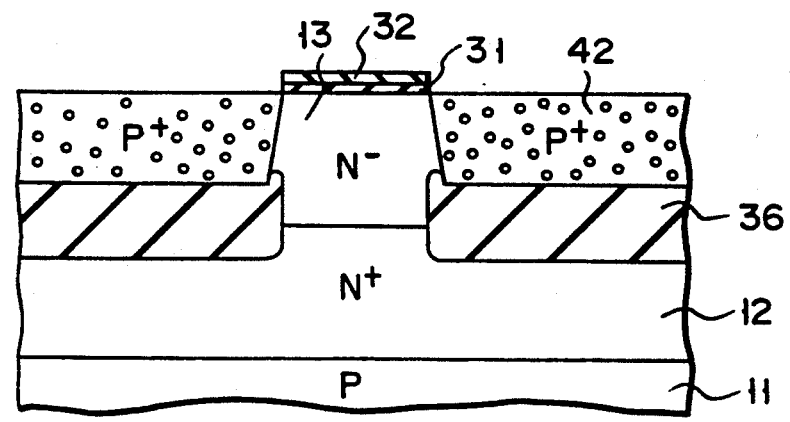
F I G. 11K

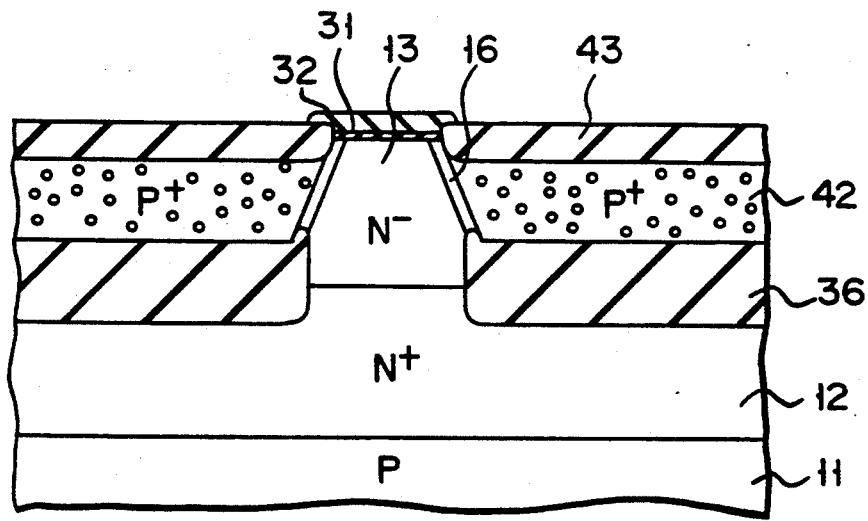
F I G. 11L
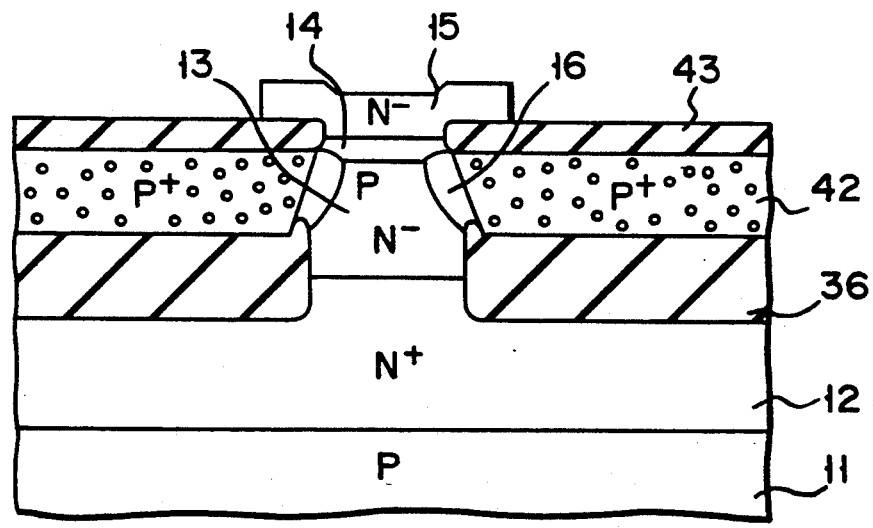
F I G. 11M

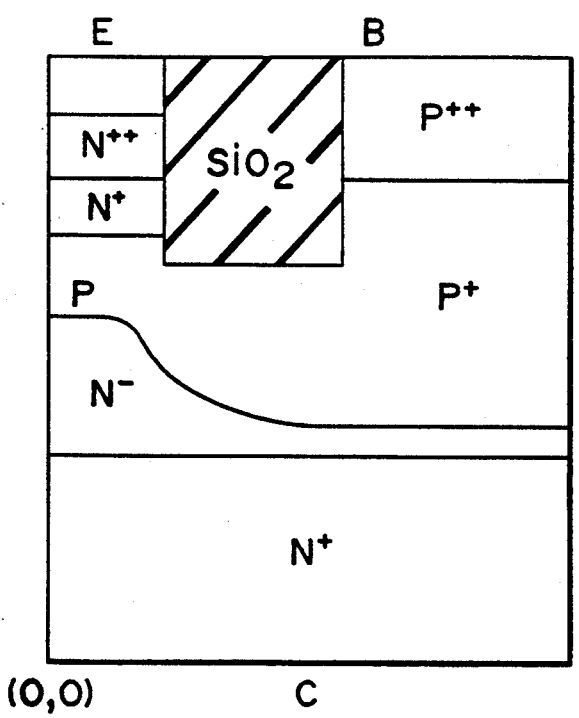
F I G. 12A
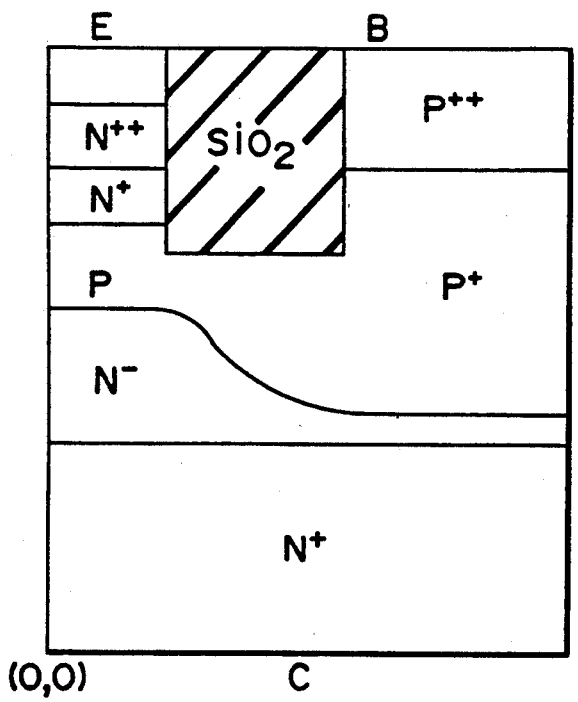
F I G. 12B

BIPOLAR TRANSISTOR

This application is a continuation of application Ser. No. 07/295,148, filed on Jan. 10, 1989, now abandoned.

BACKGROUND OF THE INVENTION

1. Field of the Invention

The present invention relates to a bipolar transistor used for forming an integrated circuit, particularly, to a bipolar transistor achieving an excellent high speed performance and operable with a small power consumption.

2. Description of the Related Art

Recently, various constructions have been proposed with respect to a bipolar transistor used for forming an integrated circuit in an attempt to provide a transistor capable of a high speed performance and operable with a small power consumption. For example, Japanese Patent Disclosure 56-80161 teaches a planar type bipolar transistor constructed as shown in FIG. 1A. This transistor, in which an emitter region 1, a base region 2 and a collector region 3 are formed by self-alignment, is featured as follows:

(1) The emitter/base junction is very small and is basically flat;

(2) The base/collector junction is basically flat and is roughly equal to the emitter/base junction in size;

(3) The emitter region 1, base region 2 and collector region 3 are surrounded by a polysilicon region 4 of a high conductivity; and (4) The polysilicon region 4 is electrically insulated from the emitter region 1 by a first insulating region 5 and from the collector region 3 by a second insulating region 6. The polysilicon region 4 also acts as a side contact for the active base region 2 and as a base contact for a metal electrode.

A bipolar transistor constructed as shown in FIG. 1B is disclosed in a literature "Flat Emitter Transistor with Self-Aligned Base" by Fujita et al, which was announced in "International Solid-State Circuits Conference, 1980" and published in "Jap. J. of Appl. Phys. vol. 20, Suppl. 20-1, pp 149-153". This transistor is featured in that the emitter/base junction is substantially flat. Also, the p-type impurity concentration in the outer base region 4 is as high as very close to the impurity concentration in the emitter region 1, leading to a low base resistance.

Further, a bipolar transistor constructed as shown in FIG. 1C is disclosed in a literature "Self-Aligned Transistor with Sidewall Base Electrode" by Nakamura et al., which was announced in "International Solid-State Circuits Conference, 1980". This transistor is featured as follows:

(1) The base/collector junction and a part of the side wall of the collector region 3 are surrounded by an insulating region 6;

(2) A polysilicon region 4 is formed on the insulating region 6 to achieve electric connection of the base region 2;

(3) The impurity in the polysilicon region 4 is diffused into a part of the collector region 3 to form an outer base region between the polysilicon region 4 and the base region 2; and (4) The outer base region is in contact with the emitter region 1 at a side part of the emitter region 1.

The conventional basic idea for enabling a bipolar transistor to achieve a high speed performance and to operate with a small power consumption is to form the p-n junction shallow in the vertical direction and to diminish the size in the horizontal direction. The transistors shown in FIGS. 1A to 1C are based on this basic idea.

The conventional theoretic study on the operation speed of a vertical bipolar transistor is based on a one dimensional model, on the assumption that the operation speed is determined by the carrier moving speed in the vertical direction. Each of the transistors shown in FIGS. 1A to 1C is based on this one dimensional model.

It has been found, however, as a result of the research made by the present inventor using a computer simulation that, in the case of a large signal amplitude, the operation speed of a bipolar transistor is determined by a factor which is not included in the one dimensional model. To be more specific, a base-widening region is formed in the collector region during operation of a bipolar transistor. What should be noted is that the carrier is charged and discharged in the two dimensional direction, i.e., both in the vertical and horizontal directions, in the base-widening region. The operation speed of the transistor is determined by the charging and discharging in the two dimensional direction in the case of a large signal amplitude.

The carriers injected through the outer base region, i.e., holes in the example of FIG. 1, are accumulated in the inner base region, leading to the "base-widening" noted above. Specifically, the carriers thus accumulated overflow the inner base region, with the result that the region substantially acting as a base is expanded into a part of the collector region. Of course, the "base-widening region" denotes the region positioned within the collector region and substantially acting as the base.

Each of the transistors shown in FIGS. 1A to 1C leaves room for further improvement in its operation speed in view of the fact that the charging and discharging in the two dimensional direction within the base-widening region is deeply related to the operation speed of a transistor. As pointed out previously, these transistors are designed on the basis of a one dimensional model, with the result that the charging and discharging speed of the carrier in, particularly, the horizontal direction is insufficient in the base-widening region. For example, the transistor shown in FIG. 1A does not include an outer base region which is in ohmic contact with the base-widening region formed in the collector region 3. It follows that the holes in the base-widening region are not directly released into the outer base region, making it necessary for the holes to be released through a bypath of a high resistance leading from the inner base region 2 to the outer base region. Naturally, the discharging takes time to obstruct the high speed operation of the transistor.

In the transistors shown in FIGS. 1B and 1C, the base-widening region is in direct contact with the outer base region 4. In these cases, however, the impurity concentration profile in the outer base region 4 is not adapted to permit the holes in the base-widening region to be released directly into the outer base region. It follows that the discharging takes time to obstruct the high speed operation of the transistor, as in the transistor shown in FIG. 1A.

SUMMARY OF THE INVENTION

An object of the present invention is to provide a bipolar transistor capable of a high speed operation. To be more specific, the present invention is intended to improve the charging and discharging speed of carriers involved in the formation of a base-widening region during operation of the transistor, particularly in the case of a large signal amplitude. To achieve the object, the impurity concentration profile in the depth direction of an outer base region is specified in a manner to improve the charging and discharging speed of carriers involved in the formation of a base-widening region.

According to the present invention, there is provided a bipolar transistor, comprising:

a buried region of a first conductivity type formed in a semiconductor substrate, said buried region having a high impurity concentration;

a collector region of the first conductivity type formed on the buried region;

a base region of a second conductivity type formed on the collector region;

an emitter region of the first conductivity type formed on the base region; and an outer base region of the second conductivity type formed to surround the base and collector regions, in such a manner that an ohmic contact is provided between the base region and said outer base region and a p-n junction is formed between the collector region and said outer base region;

wherein the concentration profile of the second conductivity type impurity in the depth direction of the outer base region is controlled in such a manner that, while the maximum voltage is applied between the base and emitter regions to turn the transistor on, the concentration of the second conductivity type impurity in the outer base region is kept higher than the concentration of the second conductivity type carrier in a base-widening region formed within the collector region, when the comparison is made at the same depth.

In the present invention, the base-widening region is in contact with the outer base region during operation of the transistor. In addition, the impurity concentration in the outer base region is higher than the carrier concentration in the base-widening region throughout the region at which the base-widening region is in contact with the outer base region. Thus, the holes in the base-widening region are directly released through the outer base region. Also, the discharge path has a low resistance. It follows that the particular construction of the present invention permits markedly improving the switching speed of the transistor.

BRIEF DESCRIPTION OF THE DRAWINGS

FIG. 4 shows the impurity concentration profile in the outer base region in the embodiment of FIG. 2;

FIG. 5A is a schematic cross sectional view used for performing a two dimensional simulation by a computer with respect to the operating characteristics of the bipolar transistor shown in FIG. 2;

FIG. 5B is a schematic cross sectional view used for performing a two dimensional simulation by a computer with respect to the operating characteristics of the conventional bipolar transistor;

FIGS. 7A and 7B are graphs showing the results of a two dimensional simulation performed by a computer with respect to the OFF characteristics of the bipolar transistor of the present invention shown in FIG. 2 and of the conventional bipolar transistor, respectively;

FIG. 8 is a cross sectional view showing a bipolar transistor according to a more preferred embodiment of the present invention;

FIGS. 9A and 9B are schematic cross sectional views used for evaluating the operating characteristics of the bipolar transistor shown in FIG. 8 by a two dimensional simulation by a computer;

FIG. 10 is a graph showing the results of a computer simulation with respect to the OFF characteristics of the bipolar transistors shown in FIGS. 9A and 9B, respectively;

FIGS. 11A to 11M are cross sectional views showing the steps of manufacturing the bipolar transistors shown in FIGS. 1 and 8;

FIGS. 12A and 12B are schematic cross sectional views used for evaluating the operating characteristics of the bipolar transistor according to the present invention by a two dimensional simulation by a computer.

DESCRIPTION OF THE PREFERRED EMBODIMENT

Figure 2:
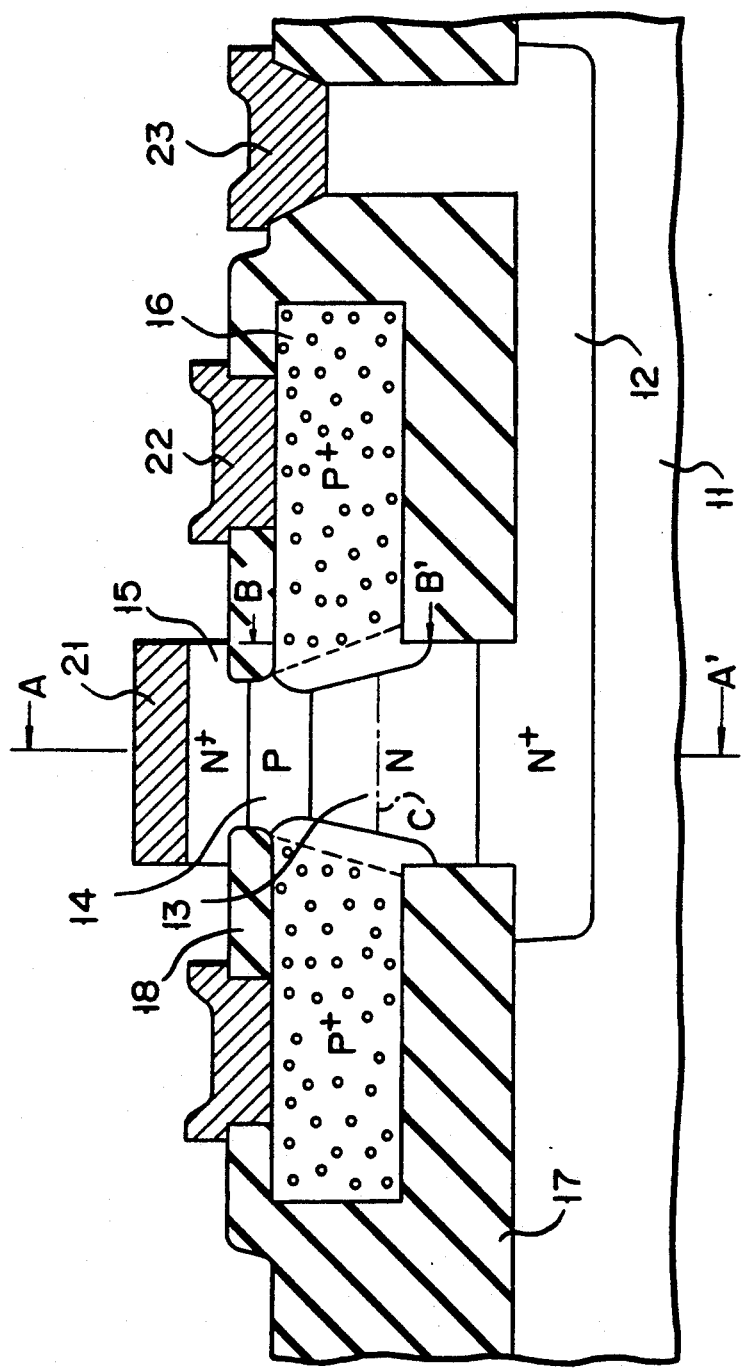
FIG. 2 is a cross sectional view showing a bipolar transistor according to one embodiment of the present invention.

FIG. 2 shows an NPN transistor according to one embodiment of the present invention. It is seen that an $N^+$-type collector buried region 12 is formed in a silicon substrate 11. Stacked on the buried region 12 are an $N^-$-type collector region 13, a P-type base region 14 and an $N^+$-type emitter region 15 in the order mentioned. A $P^+$-type outer base region 16 is formed in contact with the side surfaces of both the collector region 13 and the base region 14. As seen from the drawing, the outer base region 16 is positioned to surround the collector/base junction. The collector region 13, base region 14 and a part of the outer base region collectively form a trapezoid in cross section, as denoted by broken lines. The region of trapezoid is formed within an epitaxial layer, with the remaining portion of the outer base region being formed within a polysilicon layer. A dash-dot line C shown in the drawing denotes the range of a base-widening region formed during operation of the transistor.

Figure 1A:
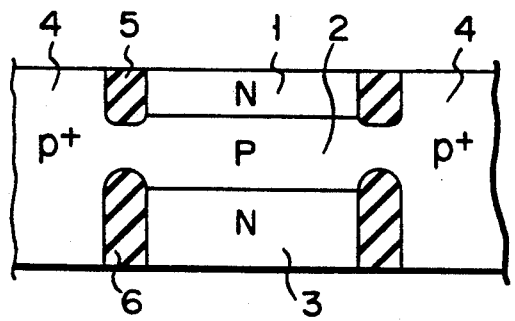
FIGS. 1A to 1C are cross sectional views each showing the gist portion of a conventional bipolar transistor.
Figure 1B:
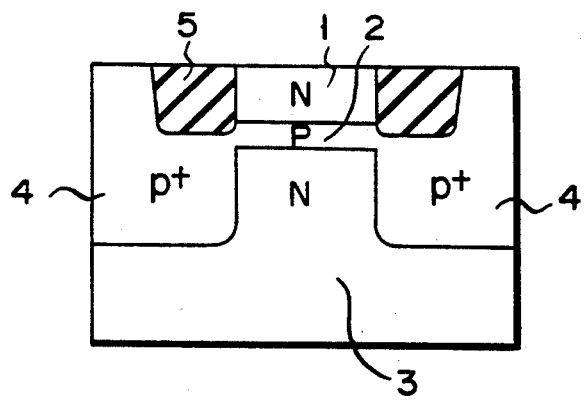
Figure 1C:
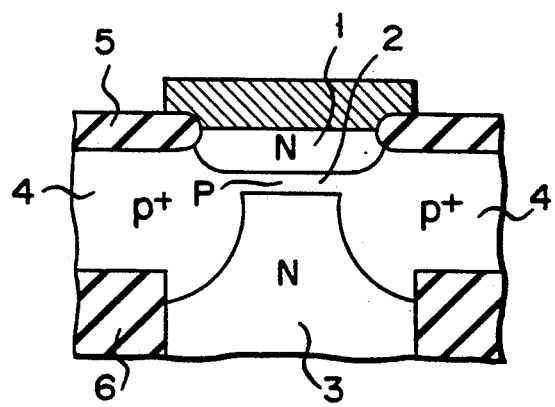

A first $SiO_2$ 17 film is buried below the outer base region 16 in a manner to surround the side surface of the collector region 13. Also, a second $SiO_2$ film 18 is formed on the outer base region 16 in a manner to surround the base-emitter junction. As a result, the emitter/base junction is flat as a whole, so as to eliminate a curved portion as shown in FIG. 1C. Reference numerals 21, 22 and 23 denote an emitter electrode, base electrode and collector electrode, respectively, each being formed of a metal such as Al.

Figure 3:
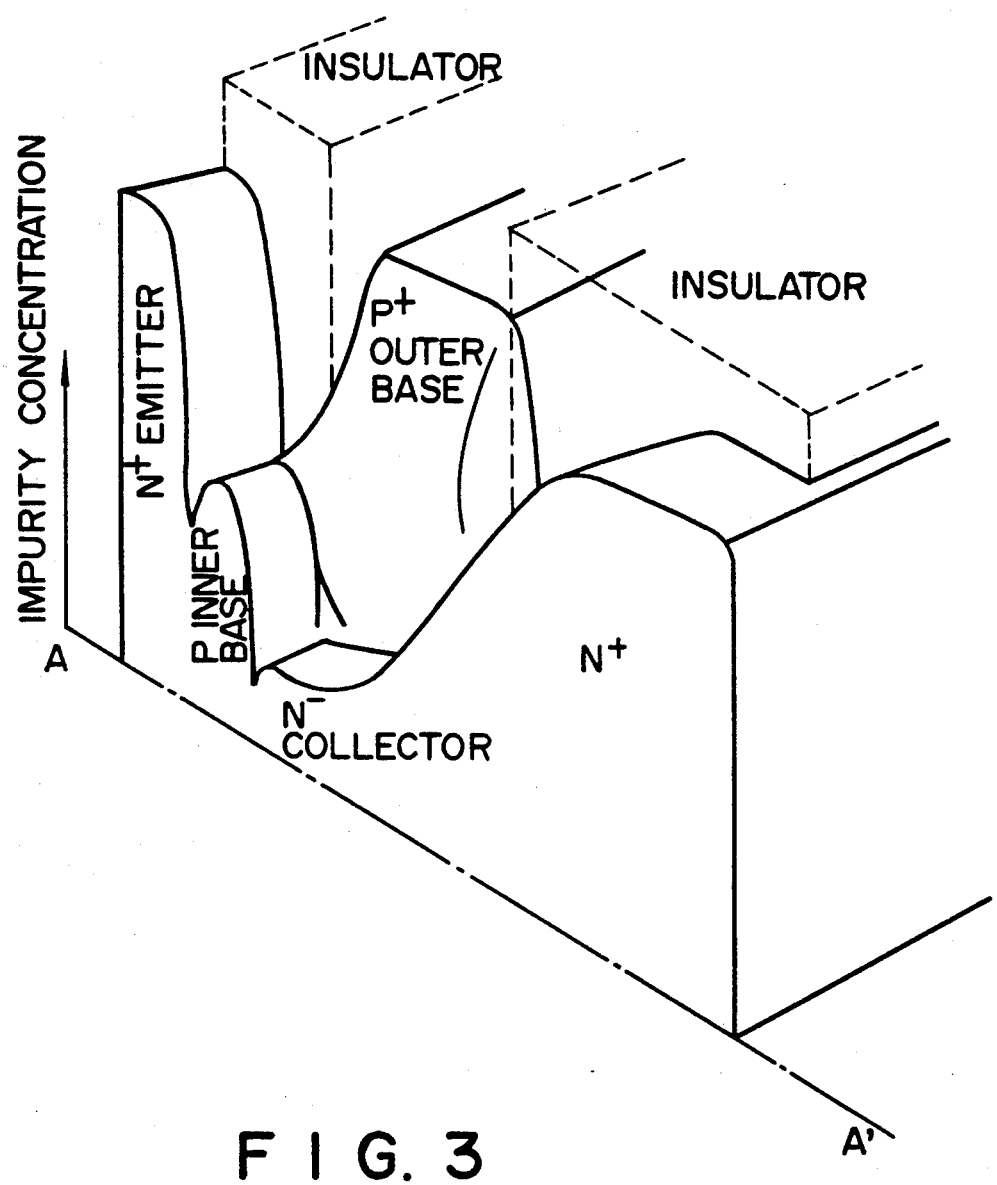
FIG. 3 schematically shows the impurity concentration profile along line A—A' in FIG. 2.

In the present invention, it is very important to pay attention to the relationship between the impurity concentration profile in the transistor, particularly, the profile in the depth direction of the outer base region 16, and the carrier concentration profile in the base widening region. FIG. 3 schematically shows the impurity concentration profile in each region, as seen rightward from line A—A' shown in FIG. 2. As apparent from FIG. 3, the impurity concentration in the outer base region is high not only at the depth at which the outer base region is in contact with the inner base region but also at the depth at which the outer base region is in contact with the collector region.

FIG. 4 shows the impurity concentration profile in the outer base region 16 in the depth direction, i.e., along line B—B' in FIG. 2, and the hole concentration profile in the base-widening region along line A—A' in FIG. 2. The hole concentration profile is in the case of the largest base-widening region formed under the state that the collector and emitter electrode potentials are set at 0 V and −1.9 V, respectively, and −1.0 V is applied to the base electrode. A broken line in FIG. 4 denotes the impurity concentration profile in the inner base region 14 along line A—A'. For comparison, the impurity concentration profile in the conventional outer base region is also denoted by a dash-dot line.

In the NPN transistor shown in FIG. 2, the impurity concentration in the outer base region is higher than the hole concentration in the base-widening region at any depth, as apparent from FIG. 4. As a result, the outer base region 16 sufficiently performs its function throughout the region in contact with the base-widening region. In other words, the entire outer base region 16 contributes to the charging of holes in forming the base-widening region and to the discharging of holes when the base-widening region vanishes. It follows that the charging/discharging efficiency is improved, leading to a marked improvement in the switching speed of the transistor. In the conventional NPN transistor, however, the impurity concentration in the outer base region is lower than the hole concentration in the base-widening region, in a region deeper than a certain level. The region of a lower impurity concentration does not perform the function of an outer base region relative to the base-widening region, leading to a lower efficiency in the charging/discharging of the base-widening region which is performed through the outer base region. It follows that the switching speed of the transistor is impaired.

The NPN transistor shown in FIG. 2 exhibits additional features. As described previously, the base/emitter junction is flat as a whole and does not include a curved region at which an electric field concentration tends to take place in the embodiment of FIG. 2. As a result, it is possible to avoid reduction in the withstand voltage between the emitter and base. It is also possible to avoid the electron injection from the emitter region 15 in the lateral direction because the base/emitter junction does not include a curved region. If electrons are injected in the lateral direction, the base-widening region formed is expanded in the lateral direction, leading to an increase in time required for the charging and discharging. In short, the base-emitter junction, which is formed flat, also serves to prevent the base-widening region from being expanded in the lateral direction so as to improve the switching speed of the transistor.

In the present invention, the impurity concentration in the outer base region 16 is rapidly changed in the lateral direction at the boundary between the inner base region 14 and the collector region 13 so as to permit high impurity concentration regions to approach to each other as much as possible in view of the withstand voltage of the transistor, thereby forming a steep wall of outer base region, as seen from FIG. 3. The steep wall of outer base region 16 also prevents the base widening region from being expanded in the lateral direction, thereby serving to improve the switching speed of the transistor.

Further, the capacitance of the outer base/collector junction is decreased by the first $SiO_2$ film 17 so as to improve the operation speed of the transistor.

In order to examine the improvement in the switching speed achieved by the NPN transistor of the particular construction, a two dimensional device simulation was applied as follows. Specifically, the NPN transistor shown in FIG. 2 was simulated on the basis of the construction shown in FIG. 5A. For comparison, a conventional NPN transistor was also simulated on the basis of the construction shown in FIG. 5B. The transistor constructed as shown in FIG. 5B is reported in "A 30-ps Si-bipolar IC Using Super Self-Aligned Process Technology" by Onaka et al., in "IEEE Transactions on Electron Device, Vol. ED33, pp 526-531, 1986". The transistor constructed as shown in FIG. 5B, which is put to practical use, is known to perform substantially the highest operation speed among the conventional transistors. In each of the Example of the present invention and the Comparative Example, the impurity concentration profile in the depth direction of the outer base region was set as shown in FIG. 4.

In the simulation, Shockley-Read-Hall (SRH) recombination and Auger recombinations were implemented. SRH and Auger recombinations become dominant in the impurity $10^{16}$–$10^{18}$ and $10^{18}$–$10^{20}$ cm$^{-3}$ doping ranges, respectively. Bandgap narrowing, due to the heavy doping effect, was also implemented.

The time dependent current-continuity equations were solved by back-ward differential method, using so-called decoupled (or Gummel) method, followed by the coupled (or Newton) method, until less than 1 micro volt potential-change and 0.01% carrier concentration-change were achieved. The time increment was set at a constant value so that the difference in the calculated electrode currents became less than 4% between two cases, twice of the value and a half of it.

Figure 6B:
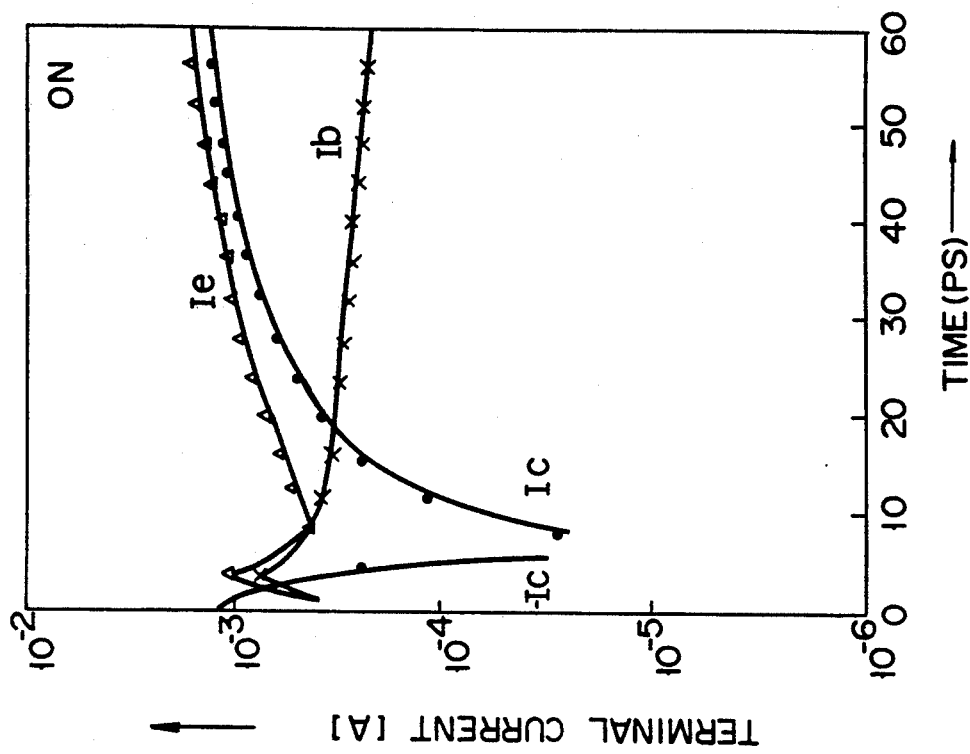
FIGS. 6A and 6B are graphs showing the results of a two dimensional simulation performed by a computer with respect to the ON characteristics of the bipolar transistor of the present invention shown in FIG. 2 and of the conventional bipolar transistor, respectively.
Figure 6A:
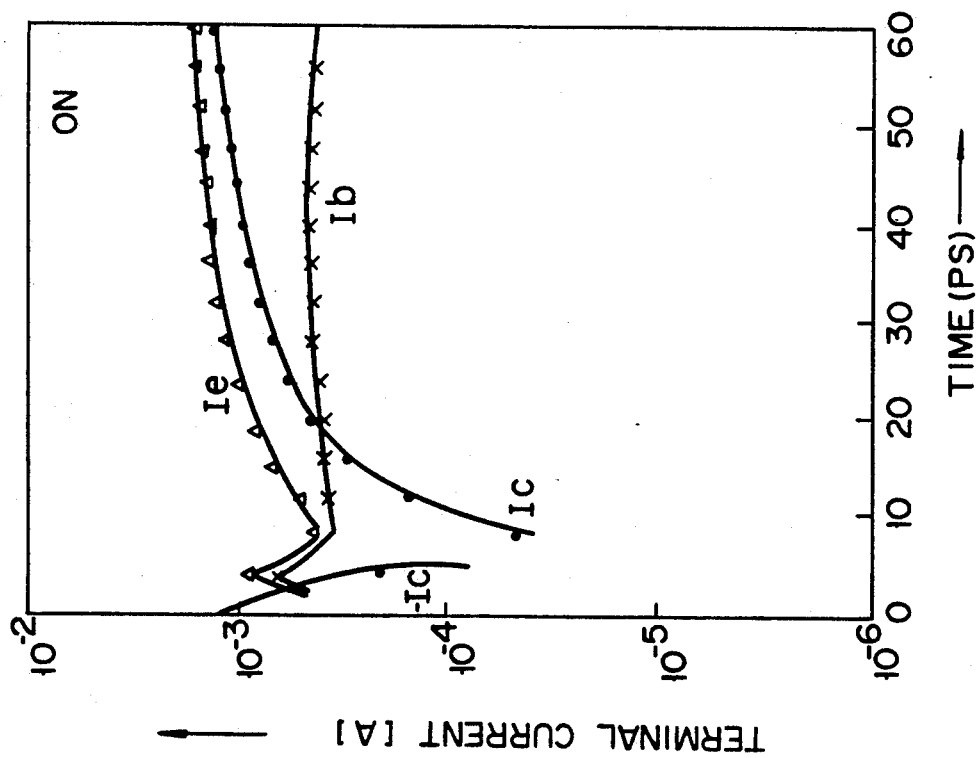

FIGS. 6A and 6B show the ON characteristics obtained by the simulation with respect to the construction of the present invention and the conventional construction, respectively. In these graphs, the starting time of changing the base potential is set at 0 ps. It is seen that the collector current Ic rises earlier in the present invention than in the conventional case in the region after the pseudo-saturation region. This indicates that holes for forming the base-widening region are charged more rapidly in the present invention than in the conventional case.

FIGS. 7A and 7B show the OFF characteristics obtained by the simulation with respect to the construction of the present invention and the conventional construction, respectively. It is seen that the time required for the collector current to decrease from the value of 90% under the steady state at 0 ps to the value of 10% is 25 ps in the present invention and 35 ps in the conventional case. In short, a marked improvement is achieved in the present invention.

As apparent from the result of the simulation reported above, the NPN transistor of the present invention permits shortening the time for charging and discharging in the base-widening region, particularly discharging time, so as to markedly improve the switching characteristics.

FIG. 8 shows an NPN transistor according to more preferred embodiment of the present invention. FIG. 8, which is common with FIG. 2 with respect to the members of the same reference numerals, clearly shows a factor, i.e., the shape of the base/emitter junction, which is not sufficiently recognized in FIG. 2. To be more specific, the junction between the inner base region 14 and the collector region 13 in FIG. 8 is flat and parallel with the flat base/emitter junction. In addition, the both ends of the base/collector junction are positioned inward of the both ends of the base/emitter junction. In short, the collector region 13 has a narrow top region. Further, the junction between the outer base region 16 and the collector region 13 is inclined to flare from the flat junction between the inner base region 14 and the collector region 13. FIG. 8 is the same as FIG. 2 with respect to the other constructions of the transistor.

The embodiment of FIG. 8 makes it possible to lower the resistance at the junction between the inner and outer base regions because the junction between the outer base region and the collector region is inclined as described above. As a result, it is possible to increase the operation speed of the transistor even where the impurity concentration in the inner base region is low. Further, the collector region 13 has a narrow top region in the embodiment of FIG. 8, making it possible to suppress the expansion of the base-widening region in the lateral direction. This also serves to improve the operation speed of the transistor.

The two dimensional device simulation as described previously was also applied to the transistor shown in FIG. 8 in order to examine the improvement in the switching characteristics (OFF characteristics) of the transistor. The simulation was performed on the basis of the construction shown in FIG. 9A. For comparison, the same simulation was also applied to an NPN transistor constructed as shown in FIG. 9B. As seen from the drawing, each of the emitter/base junction and the inner base/collector junction is flat in FIG. 9B. In addition, these junctions are parallel with each other. In FIG. 9B, however, the both ends of the inner base/collector junction is positioned outward of the both ends of the base/emitter junction. Also, the outer base/collector junction is not inclined to flare from the flat junction between the inner base region and the collector region.

Values close to the voltage region used in a high speed bipolar transistor circuit were used in the simulation. Specifically, the base electrode potential was linearly changed from $-1.0$ V to $-1.4$ V during the period of 4 ps, with the collector electrode potential and the emitter electrode potential fixed to 0 V and $-1.9$ V, respectively. FIG. 10 shows the change with time in the collector current. The time required for the collector current to be lowered from the value of 90% of the steady state at 0 ps to the value of 10% is 26 ps for the construction of FIG. 9B and 17 ps for the construction shown in FIG. 9A. In other words, the embodiment of FIG. 8, in which the both ends of the inner base/collector junction are positioned inward of the both ends of the base/emitter junction and the outer base/collector junction is inclined to flare from the flat inner base/collector junction, is capable of achieving a marked improvement in the OFF characteristics of the transistor.

It should be noted that the inherent advantages of the embodiment of FIG. 8 due to the narrow top region of the collector region and due to the inclined outer base/collector junction is also obtained, without the featured impurity profile in the outer base region 16.

Figure 13B:
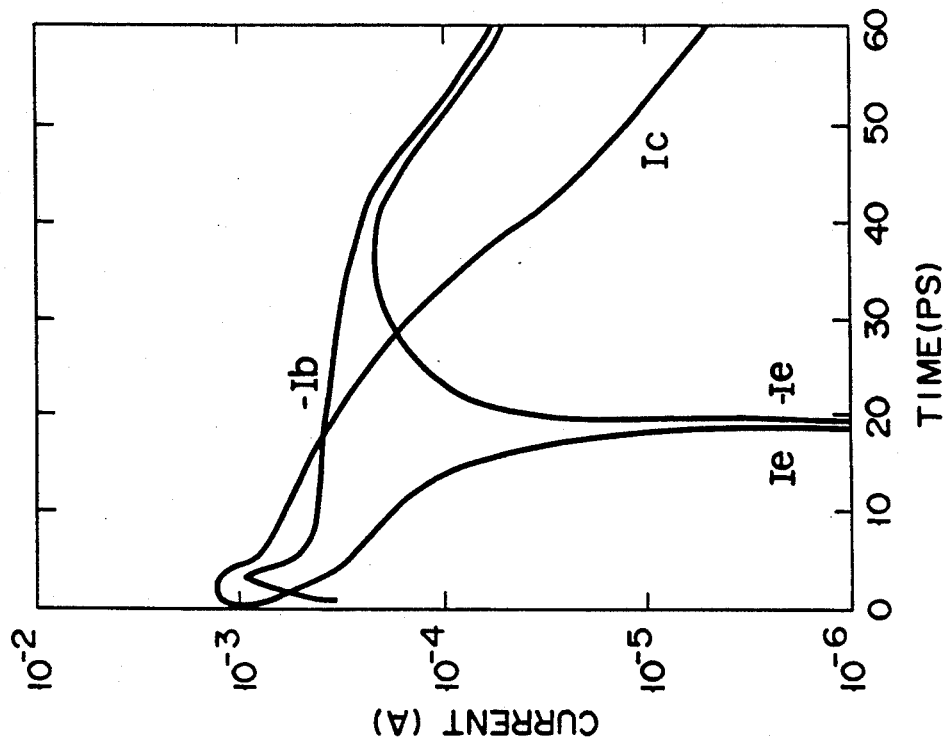
FIGS. 13A and 13B are graphs showing the results of a computer simulation with respect to the OFF characteristics of the bipolar transistors shown in FIGS. 12A and 12B, respectively.
Figure 13A:
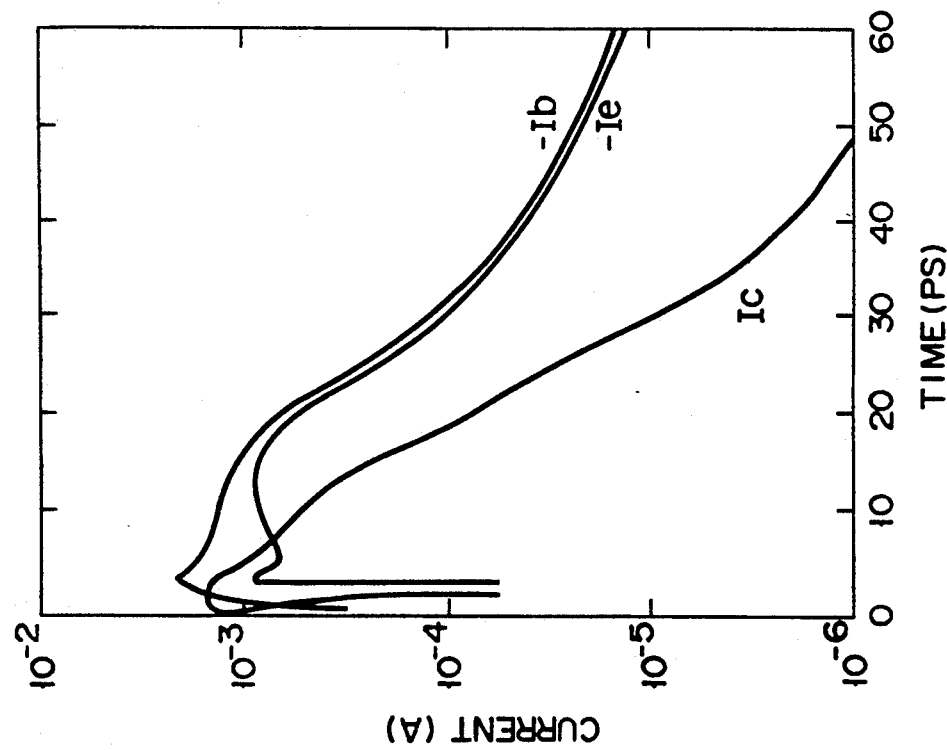

Among these two factors of shape, the factor of the narrow top region of the collector region is particularly important. A sufficient effect can be obtained by only this factor of shape. In this connection, a two dimensional device simulation was performed by a method similar to that described above with respect to the bipolar constructions shown in FIGS. 12A and 12B in order to examine the OFF characteristics for each bipolar construction. In this simulation, the width of the top flat surface of the $N^-$-collector region was set at 0.2 um for FIG. 12A (or 0.1 um for the right half shown in the drawing) and at 0.4 um for FIG. 12B (or 0.2 um for the right half shown in the drawing). The impurity profile of the outer base region was set equal to the control case shown in FIG. 4. Specifically, the impurity concentration of the outer base region was set at $1 \times 10^{19}/\text{cm}^3$ in the top surface and at $1 \times 10^{16}/\text{cm}^3$ at the junction with the $N^-$-collector region. The simulation was performed to cover the right half portion shown in the drawings. FIGS. 13A and 13B show the results of the simulation. It is seen that the time required for the collector current to be lowered from the value of 90% of the steady state at 0 ps to the value of 10% is 30 ps for the construction of FIG. 12B and 17 ps for the construction shown in FIG. 12A. This indicates that a marked improvement in the OFF characteristics of the transistor can be achieved by only the factor that the both ends of the inner base/collector junction are positioned inward of the both ends of the base/emitter junction.

The NPN transistor of FIG. 8 is manufactured as follows. In the first step, an $N^+$-type collector buried region 12 is formed by doping a high concentration of an N-type impurity in a P-type silicon substrate 11, as shown in FIG. 11A. Arsenic, antimony, etc. can be used as the N-type impurity. Then, an $N^-$-type epitaxial silicon layer 13 about 1 um thick is formed on the collector buried region 12 by an epitaxial growth method, as shown in FIG. 11B. The surface of the N-type epitaxial silicon layer is thermally oxidized to form a silicon oxide film 31 about 500Å thick, followed by successively forming a silicon nitride film 32, a silicon oxide film 33 and a silicon nitride film 34 by CVD to provide a laminate structure.

The laminate structure shown in FIG. 11B is selectively etched by an anisotropic reactive ion etching (RIE), with a resist pattern used as an etching mask. The same resist pattern is used in this step to selectively etch the silicon nitride film 34, silicon oxide film 33, silicon nitride film 32, silicon oxide film 31 and $N^-$-type epitaxial silicon layer 13, followed by partly etching the $N^+$-type collector buried region 12 so as to obtain a mesa structure 35 shown in FIG. 11C. It is important to enable the mesa structure 35 to have an inclined side surface in order to form the inclined junction referred to previously in conjunction with FIG. 8. The side surface of the mesa structure 35 and the exposed surface of the collector buried region 12 are thermally oxidized to form a thermal oxide film 100Å thick, followed by depositing by CVD a silicon oxide film 36 having a thickness of 4,000Å. Further, the oxide film 36 is coated with a thick resist film 37 for flattening the surface so as to obtain the structure shown in FIG. 11D. Then, the entire surface is etched by RIE until the silicon oxide film 36 covering the upper surface of the mesa structure is removed, as seen from FIG. 11E.

The silicon oxide film 36 is further etched until that portion of the oxide film 36 which is positioned between the mesa structure, followed by removing the resist film 37 so as to obtain the structure shown in FIG. 11F. After removal of the resist film, the exposed surface of the mesa structure is thermally oxidized to form a thin silicon oxide film 38. Then, a silicon nitride film 39 is deposited by CVD to obtain the structure shown in FIG. 11G. It should be noted that the silicon nitride film 39 is made integral with the silicon nitride film 34 formed previously on the top surface of the mesa structure, resulting in an increased thickness of the silicon nitride film on the top surface of the mesa structure. Then, an anisotropic etching by RIE is applied to remove the newly deposited silicon nitride film 39. As a result, the silicon nitride film remains to cover only the side surface and the top of the mesa structure so as to form an oxidation resistant cap 40, as shown in FIG. 11H. In the next step, a selective wet oxidation is performed by using the oxidation resistant cap 40 as a mask, with the result that the silicon oxide film 36 grows inward the mesa structure. As shown in FIG. 11I, the silicon region is narrowed below the mesa structure by the silicon oxide film 41 which has newly grown as a result of the selective wet oxidation treatment.

The oxidation resistant cap 40 and the silicon oxide films 38, 33 are then removed, followed by depositing by CVD a P+-type polysilicon layer 42 containing a high concentration of boron so as to obtain the structure shown in FIG. 11J. Further, the polysilicon layer 42 is coated with a thick resist film so as to flatten the surface, followed by applying RIE. As a result, the surface of the polysilicon layer 42 is made flush with the surface of the N−-type region included in the mesa structure, as shown in FIG. 11K.

In the next step, a selective thermal oxidation is performed by using the silicon nitride film 32 as an oxidation resistant mask so as to form an oxide film 43 on the surface of the polysilicon layer 43, as shown in FIG. 11L. During the thermal oxidation treatment, the boron contained in the polysilicon layer 42 is diffused into a part of the N−-type epitaxial region 13 so as to form an outer base region 16. After formation of the oxide film 43, the silicon nitride film 32 and the silicon oxide film 31 are removed by etching, followed by depositing an amorphous silicon film containing arsenic. An inner base region 14 is then formed by implanting boron ions into the N−-type epitaxial layer 16 through the amorphous silicon film. The boron ions thus implanted are activated by an annealing treatment so as to achieve an electric connection between the outer base region 16 and the inner base region 14. The annealing treatment also permits the amorphous silicon film to be converted into an N+-type monocrystalline silicon film. The N+-type silicon film thus formed is patterned in a desired shaped to form an emitter region 15, as shown in FIG. 11M. Finally, contact holes are formed as desired, and Al electrodes and Al wiring are formed by Al deposition and patterning of the deposited Al layer.

The present invention is not restricted to the embodiments described above. For example, the outer base region 16 is formed of polysilicon in the embodiment described above. However, it is possible for the outer base region to be formed of monocrystalline silicon. For example, SOI (Silicon on Insulator) technology can be used for forming the outer base region of monocrystalline silicon. The use of monocrystalline silicon permits reducing the base resistance and base current, leading to further improvements in the characteristics of the transistor.

In the embodiments described above, the technical idea of the present invention is applied to a NPN transistor. However, the technical idea of the present invention can also be applied to a PNP transistor. Further, it is possible to eliminate the insulation film 17 where the capacitance of the outer base/collector junction is negligible.

What is claimed is:

1. A bipolar transistor, comprising:
   a buried region of a first conductivity type formed in a semiconductor substrate, said buried region having a high impurity concentration;
   a collector region of the first conductivity type formed on the buried region;
   a base region of a second conductivity type formed on the collector region;
   an emitter region of the first conductivity type formed on the base region; and
   an outer base region of the second conductivity type formed to surround the base and collector regions in such a manner that an ohmic contact is provided between the base region and said outer base region and a p-n junction is formed between the collector region and said outer base region;
   wherein the concentration profile of the second conductivity type impurity in the depth direction of the outer base region is controlled in such a manner that, while the maximum voltage is applied between the base and emitter regions to turn the transistor on, the minimum concentration of the second conductivity type impurity in the outer base region is kept not lower than the maximum concentration of the second conductivity type carrier in a base-widening region formed within the collector region, when the comparison is made at the same depth,
   said concentration profile contributing to the charging of carriers in formed the base-widening region and to the discharging of carriers when the base-widening region vanishes.

2. The bipolar transistor according to claim 1, wherein the junction between the base region and the emitter region is flat as a whole and does not include a curved portion.

3. The bipolar transistor according to claim 2, wherein an insulation film is formed to surround the side end of the junction between the base region and the emitter region.

4. The bipolar transistor according to claim 1, wherein an insulation film is formed below the outer base region to surround the side end of the collector region.

5. A bipolar transistor, comprising:
   a buried region of a first conductivity type formed in a semiconductor substrate, said buried region having a high impurity concentration;
   a collector region of the first conductivity type formed on the buried region;
   a base region of a second conductivity type formed on the collector region;
   an emitter region of the first conductivity type formed on the base region; and
   an outer base region of the second conductivity type formed to surround the base and collector regions in such a manner that an ohmic contact is provided between the base region and said outer base region and a p-n junction is formed between the collector region and said outer base region;

wherein the concentration profile of the second conductivity type impurity in the depth direction of the outer base region is controlled in such a manner that, while the maximum voltage is applied between the base and emitter regions to turn the transistor on, the minimum concentration of the second conductivity type impurity in the outer base region is kept not lower than the maximum concentration of the second conductivity type carrier in a base-widening region formed within the collector region, when the comparison is made at the same depth;

the PN junction formed between the base region and the emitter region is flat as a whole and does not include a curved portion;

the PN junction formed between the base region and the collector region is parallel with the PN junction between the base and emitter regions, and the both ends of the PN junction between the base and collector regions are positioned inside the both ends of the PN junction between the base and emitter regions; and the PN junction formed between the collector region and the outer base region is inclined to flare from the flat PN junction between the base and collector regions, said concentration profile contributing to the charging of carriers in forming the base-widening region and to the discharging of carriers when the base-widening region vanishes.

6. The bipolar transistor according to claim 5, wherein an insulation film is formed to surround the side end of the junction between the base region and the -emitter region.

7. The bipolar transistor according to claim 5, wherein an insulation film is formed below the outer base region to surround the side end of the collector region.

8. A bipolar transistor, comprising:
a buried region of a first conductivity type formed in a semiconductor substrate, said buried region having a high impurity concentration;
a collector region of the first conductivity type formed on the buried region;
a base region of a second conductivity type formed on the collector region;
an emitter region of the first conductivity type formed on the base region; and
an outer base region of the second conductivity type formed to surround the base and collector regions in such a manner that an ohmic contact is provided between the base region and said outer base region and a p-n junction is formed between the collector region and said outer base region;
wherein the PN junction formed between the base region and the emitter region is flat as a whole and does not include a curved portion; and
the PN junction formed between the base region and the collector region is parallel with the PN junction between the base and emitter regions, and the both ends of the PN junction between the base and collector regions are positioned inside the both ends of the PN junction between the base and emitter regions.

9. The bipolar transistor according to claim 8, wherein the PN junction formed between the collector region and the outer base region is inclined to flare from the flat PN junction between the base and collector regions.

10. The bipolar transistor according to claim 8, wherein an insulation film is formed to surround the side end of the junction between the base region and the emitter region.

11. The bipolar transistor according to claim 8, wherein an insulation film is formed below the outer base region to surround the side end of the collector region.

* * * * *